(12) United States Patent
Waechter et al.

(10) Patent No.: US 6,172,369 B1
(45) Date of Patent: Jan. 9, 2001

(54) FLAT PANEL DETECTOR FOR RADIATION IMAGING WITH REDUCED TRAPPED CHARGES

(75) Inventors: David Waechter, Hawkesbury; Wei Zhou; John Rowlands, both of Toronto; Zhong Shou Huang, Mississauga, all of (CA)

(73) Assignee: IFire Technology, Inc., Fort Saskatchewan (CA)

( * ) Notice: Under 35 U.S.C. 154(b), the term of this patent shall be extended for 0 days.

(21) Appl. No.: 09/000,483
(22) PCT Filed: Jul. 31, 1995
(86) PCT No.: PCT/CA95/00460
  § 371 Date: Jul. 21, 1998
  § 102(e) Date: Jul. 21, 1998
(87) PCT Pub. No.: WO97/05659
  PCT Pub. Date: Feb. 13, 1997
(51) Int. Cl.[7] .................................................. H01G 27/146
(52) U.S. Cl. .................. 250/370.09; 250/370.14
(58) Field of Search .................. 250/370.09, 370.01, 250/370.08, 370.14, 208.1; 257/448

(56) References Cited

U.S. PATENT DOCUMENTS

| 4,382,187 | 5/1983 | Fraleux et al. . |
| 4,689,487 | 8/1987 | Nishiki et al. . |
| 5,079,426 | 1/1992 | Antonuk et al. . |
| 5,396,072 | 3/1995 | Schiebel et al. . |

FOREIGN PATENT DOCUMENTS 0 574 690 A2   12/1993   (EP) .

OTHER PUBLICATIONS

W. Zhao et al. "Digital Chest Radiology Using Self–Scanned Readout of Amorphous Selenium", *Medical Physics*, vol. 18, No. 5, Sep./Oct. 1991, pp. 1073.

T. Tsukada, et al., "New Solid–State Image Pickup Devices Using Photosenstive Chalcogenide Glass Film", Proceedings of IEEE International Electronic Devices Meeting, 1979, pp. 134–136.

H. Tsutsui, et al., "X–Ray Energy Separation Method Using a CdTe Semiconductor X–Ray Imaging Sensor and Photon Counting Method," *IEEE Transactions on Nuclear Science*, vol. 40, No. 1, (Feb. 1993) pp. 40–44.

*Primary Examiner*—Seungsook Ham
*Assistant Examiner*—Richard Hanig
(74) *Attorney, Agent, or Firm*—Fay, Sharpe, Fagan, Minnich & McKee, LLP (57) ABSTRACT

A flat panel detector for radiation imaging includes an array of transistor switches each of which is associated with a pixel electrode. A radiation transducer including a top electrode and a radiation conversion layer is disposed over the array. Inhibiting mechanisms are positioned over dead zones between adjacent pixel electrodes to inhibit the accumulation of charge in the radiation conversion layer at the dead zones when the top electrode is biased and the flat panel detector is exposed to radiation. In one embodiment, the inhibiting mechanism is constituted by islands formed of semiconductor material between the array and the radiation transducer. Each island is positioned over a dead zone between adjacent pixel electrodes and contacts a pixel electrode to allow charges accumulated on the islands to drift to the pixel electrodes.

14 Claims, 7 Drawing Sheets

FLAT PANEL DETECTOR FOR RADIATION IMAGING WITH REDUCED TRAPPED CHARGES

TECHNICAL FIELD

The present invention relates to imaging systems and in particular to a flat panel detector for radiation imaging.

BACKGROUND ART

X-ray imaging systems are widely used in medical diagnosis and industrial and security inspection environments. One well known prior art x-ray imaging system is commonly referred to as an x-ray image intensifier ("XII") system. The XII system includes a large image tube that converts a low intensity x-ray image into a visible image. Incident x-rays are transmitted through a low absorbing window, then absorbed by an input phosphor screen and converted into a light image. On the inner surface of the input phosphor screen is a photocathode which converts the light into photoelectrons. The photoelectrons are accelerated and focused by an electrical static lens. The focused photoelectrons bombard an output phosphor screen and are converted into an optical image. A charge-coupled device ("CCD") or a camera tube is coupled to the output phosphor screen to convert the light image into an electronic video signal.

However, the XII system suffers from a number of problems due to the multiple conversion stages, resulting in a reduction in image resolution and image contrast as well as pincussion distortion caused by the magnification error of the electrical static lens. Moreover, the XII system is complex and bulky.

To overcome the problems associated with the XII system, alternative x-ray imaging systems employing flat-panel radiation image sensors have been proposed. For example, U.S. Pat. No. 4,382,187 to Fraleux et al. and U.S. Pat. No. 4,689,487 to Nishiki et al. disclose early designs of large area flat-panel radiation image sensors for use in radiation imaging systems. These flat-panel sensors are responsive to incident x-rays and generate output signals representative of a radiation image.

U.S. Pat. No. 5,079,426 to Antonuk et al. discloses a direct-detection x-ray image sensor incorporating an amorphous silicon thin film transistor ("TFT") switch and photodiode array. X-rays are detected by a phosphor screen that is placed on the top of the TFT switch and photodiode array. When x-rays interact with the phosphor film, light photons are generated and converted into electronic charges by the photodiode array. The charges are read out via the TFT switches to generate an image. However, problems exist with this sensor. Because the sensor employs a phosphor screen to detect the x-rays, blurring occurs due to the fact that the light photons are emitted in all directions and are scattered inside the phosphor screen. This results in a poor image resolution.

In an article entitled "New solid-state image pickup devices using photosensitive chalcogenide glass film," by T. Tsukada et al., published in the Proceedings of IEEE International Electron Devices Meeting, 1979, pp.134–136, a solid state image sensor is disclosed including a photoconductive selenium film deposited on a n-channel MOSFET switch array made from crystalline silicon. Although this image sensor is suitable for some imaging applications, it is not suited for large area radiation imaging applications due to the difficulties in fabricating a large sensor array on a crystalline silicon wafer.

In an article entitled "Digital radiology using self-scanned readout of amorphous selenium," authored by W. Zhao et al. presented at COMP91, Canadian organization of Medical Physicists, Winnipeg, Manitoba, Canada, Jun. 19, 1991, a flat-panel x-ray image sensor is disclosed. The image sensor includes a thick amorphous selenium film (a-Se) on a two-dimensional TFT switch array. The TFT switches are arranged in rows and columns to form a two-dimensional imaging system. Gate lines interconnect the TFT switches in each row while source lines interconnect the TFT switches in each column. The thick selenium film is deposited directly on top of the TFT switch array and a top electrode is deposited on the selenium film. When x-rays are incident on the selenium film and the top electrode is biased with a high voltage, electron-hole pairs are generated and separated by the electric field across the thickness of the selenium film. The holes which are driven by the electric field move toward the pixel electrodes (i.e. the drain electrodes of the TFT switches) and accumulate. This results in a charge being held by the pixel electrodes which can be used to develop an x-ray image. The charge held by the pixel electrodes can be read by supplying a pulse to each gate line. When a gate line receives a pulse, the TFT switches in the row turn on, allowing the signal charges on the pixel electrodes to flow to the source lines. Charge amplifiers connected to the source lines sense the charge and provide output voltage signals proportional to the charge and hence, proportional to the radiation exposure on the selenium film.

Because a thick amorphous selenium film is deposited on the TFT switch array, a few problems may arise which reduce image quality. During X-ray exposure, most of the holes are drawn to the pixel electrodes by the applied electric field, but some of them are drawn to the dielectric film which overlies the source and gate lines. As this occurs, the electric field above the dielectric film decreases. Because the quantum efficiency of an a-Se film is approximately approportional to the electric field in the bulk of the a-Se film, signal charges generated by x-ray exposure of the a-Se film decline. Once the electric field decreases to a certain level, x-ray generated holes become trapped in the bulk of the selenium film above the dielectric film. Also, the trapped holes in the bulk of the selenium film may be released slowly by thermal energy and collected by adjacent pixel electrodes, resulting in decay-lag which again affects image quality.

European Patent No. 0,588,397 discloses an x-ray imaging device designed to deal with the above described problems. The x-ray imaging device includes a doped semiconductor layer covering all of the TFT switch array with the exception of the pixel electrodes. The doped semiconductor film allows holes collected in the semiconductor film above the source and gate lines (i.e. the area between adjacent pixel electrodes) to drift towards the pixel electrodes. However, one problem exists in that since the semiconductor layer overlays the entire area of the TFT switch array between the pixel electrodes, a diffusion of charges from one pixel area to adjacent pixel areas may occur especially around bright image locations. This results in a reduction in image resolution. Accordingly, there is a need for an improved flat panel detector for radiation imaging.

It is therefore an object of the present invention to provide a novel flat panel detector for radiation imaging which obviates or mitigates at least one of the above-mentioned problems.

DISCLOSURE OF THE INVENTION

According to one aspect of the present invention there is provided a flat panel detector for radiation imaging comprising:

an array of pixels each of which includes a pixel electrode to store a charge proportional to the exposure of said pixel to radiation;

a radiation transducer over said array to be exposed to incident radiation; and means positioned over dead zones between adjacent pixel electrodes to inhibit the accumulation of charge in said radiation transducer over said dead zones.

According to another aspect of the present invention there is provided a flat panel detector for radiation imaging comprising:

a radiation transducer including a radiation conversion layer and an electrode on one side of said radiation conversion layer;

an array of pixels arranged in rows and columns on the other side of said radiation conversion layer, each of said pixels including a pixel electrode to accumulate charge as a result of hole drift in said radiation conversion layer occurring upon exposure of said radiation transducer to radiation and when said electrode is biased;

a plurality of sources lines upon which charges accumulated by said pixels can be sensed, each of said source lines connecting the pixels in one of said rows or columns;

a plurality of gate lines upon which gating signals are supplied to allow accumulated charges to be sensed, each of said gate lines connecting the pixels in the other of said rows or columns; and means to inhibit the accumulation of charge in said radiation transducer over dead zones between adjacent pixel electrodes.

In still yet another aspect of the present invention there is provided in a method of forming a flat panel detector for radiation imaging including a radiation transducer having a radiation conversion layer and an electrode on one side thereof and an array of pixels arranged in rows and columns on the other side of said radiation conversion layer, each pixel including a pixel electrode to store charge proportional to the exposure of said flat panel detector to radiation, said method further comprising the step of:

providing means over dead zones between adjacent pixel electrodes to inhibit the accumulation of charge in said radiation transducer.

In one embodiment, the means to inhibit is in the form of semiconductor material film islands at the dead zones between adjacent pixel electrodes which allow charges trapped therein to migrate towards a pixel electrode. In another embodiment, it is preferred that the means to inhibit is in the form of a patterned electrode forming part of the radiation transducer so that no electrode exists at the dead zones. In yet another embodiment, it is preferred that the means to inhibit is in the form of an insulator between the electrode and the radiation conversion layer at the dead zones.

By preventing charges from being trapped in the radiation conversion layer and inhibiting charges from migrating to a plurality of adjacent pixel sensors, the flat panel detector allows for the creation of higher resolution radiation images.

BRIEF DESCRIPTION OF THE DRAWINGS

Embodiments of the present invention will now be described more fully with reference to the accompanying drawings in which.

BEST MODES FOR CARRYING OUT THE INVENTION

Figure 1:
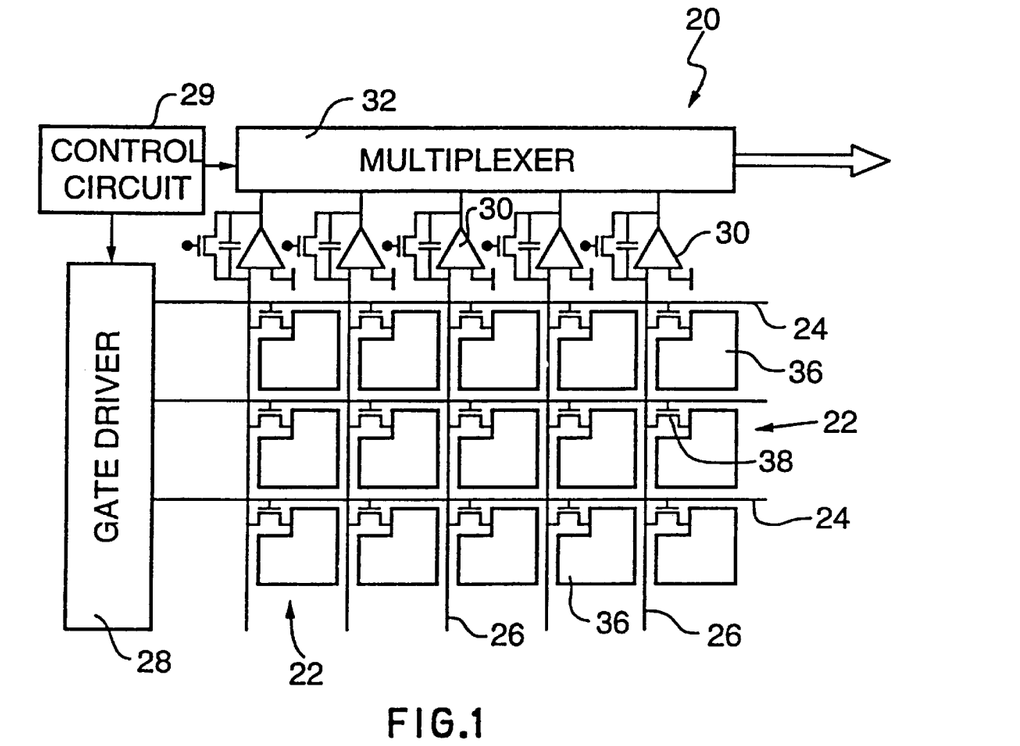
FIG. 1 is a schematic of a flat panel detector for radiation imaging.

Referring now to FIG. 1, a flat panel detector for radiation imaging is shown and is generally indicated by reference numeral 20. The flat panel detector includes a plurality of pixels 22 arranged in rows and columns. Gate lines 24 interconnect the pixels 22 of each row while source lines 26 interconnect the pixels 22 of each column. The gate lines 24 lead to a gate driver circuit 28 which provides pulses to the gate lines in succession in response to input from a control circuit 29. The source lines 26 lead to charge amplifiers 30 which in turn are connected to an analog multiplexer 32. The analog multiplexer provides image output which can be digitized to create a digitized radiation image in response to input from the control circuit 29.

Figure 2:
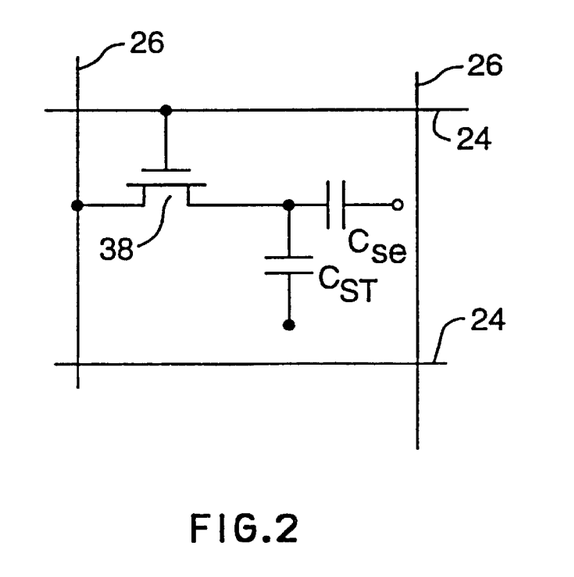
FIG. 2 is an equivalent circuit of a pixel forming part of the flat panel detector illustrated in FIG. 1.

FIG. 2 shows an equivalent circuit of one of the pixels 22. As can be seen, the pixel includes a radiation transducer $C_{SE}$ coupled to a storage capacitor $C_{ST}$ in the form of a pixel electrode 36. The pixel electrode 36 constitutes the drain electrode of a thin film transistor ("TFT") switch 38. The source electrode of TFT switch 38 is coupled to one of the source lines 26 while the gate electrode of the TFT switch 38 is coupled to one of the gate lines 24.

When the radiation transducer $C_{SE}$ is biased and is exposed to radiation, it causes the pixel electrode 36 to store a charge proportional to the exposure of the radiation transducer $C_{SE}$ to radiation. Once charged, the charge can be read by supplying a gating pulse to the gate terminal of TFT switch 38. When the TFT switch receives the gate pulse, it connects the pixel electrode 36 to the source line 26 allowing the pixel electrode to discharge. The charge on the source line 26 is detected by the charge amplifier 30 which in turn generates an output voltage proportional to the detected charge. The output voltage of the charge amplifier 30 is conveyed to the analog multiplexer 32.

The design of the pixels 22 is such to obviate or mitigate at least some of the disadvantages associated with the prior art designs discussed previously by reducing the occurrence of charges being trapped in the radiation conversion layer in the dead zones of the flat panel detector between adjacent pixel electrodes 36.

Figure 3:
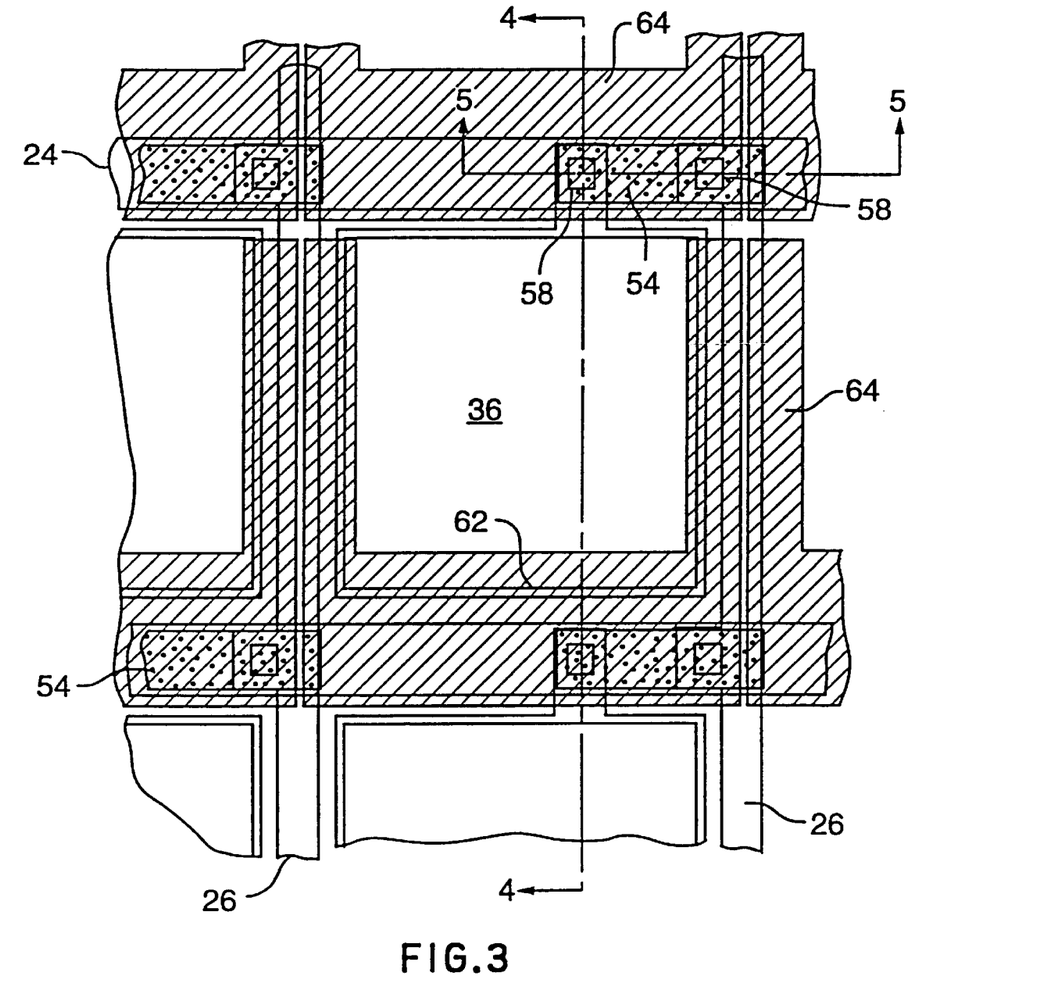
FIG. 3 is a top plan view of a portion of the flat panel detector of FIG. 1.
Figure 4:
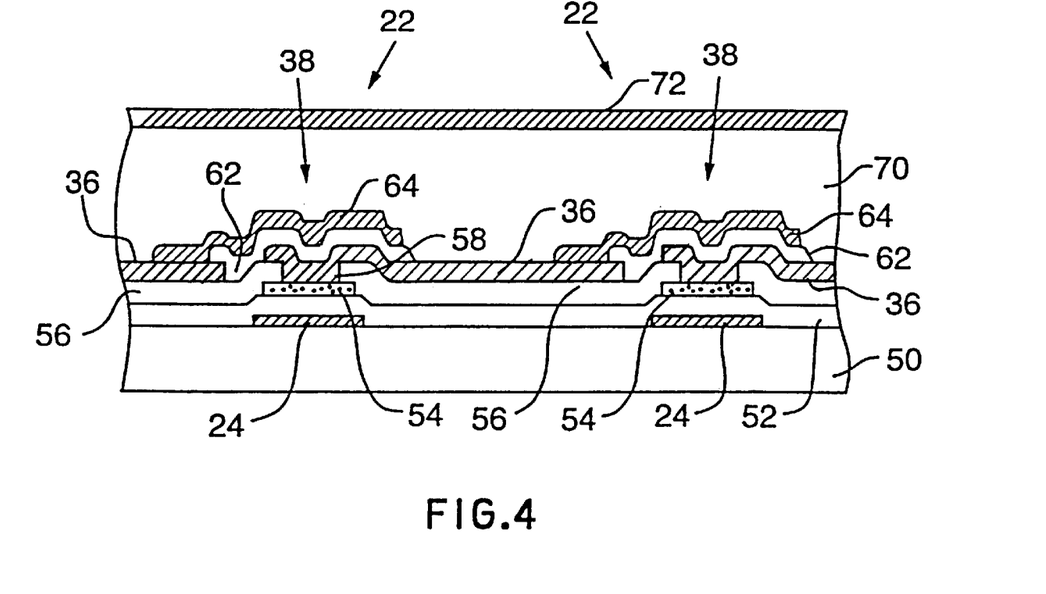
FIG. 4 is a cross-sectional view of FIG. 3 taken along line 4—4.
Figure 5:
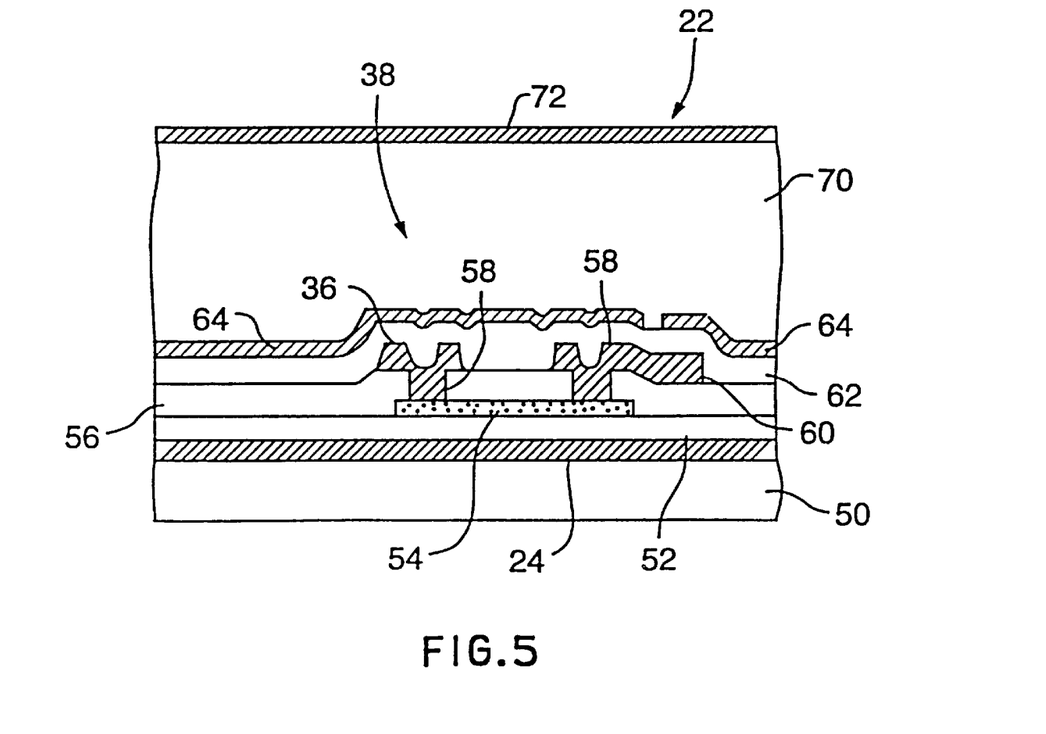
FIG. 5 is a cross-sectional view of FIG. 3 taken along line 5—5.

Referring now to FIGS. 3, 4 and 5, a portion of the array of pixels 22 formed in accordance with the present invention is shown. The pixels 22 including the gate and source lines 24 and 26 are fabricated on a common glass substrate 50. Deposited on the substrate 50 are the chromium gate lines 24. A gate insulating layer 52 formed of SiO$_2$ or SiN$_x$ overlies the substrate 50 and the gate lines 24.

Deposited on the gate insulating layer 52 above the gate lines 24 are semiconductor material layers formed of cadmium selenide (CdSe) defining the channels 54 of each TFT switch 38. A passivation layer 56 in the form of an SiO$_2$ layer overlies the gate insulating layer 52 and the channels 54. Vias 58 are provided in the passivation layer 56 to expose a portion of each channel 54. Contacting each channel 54 through one of the vias 58 and overlying a portion of the passivation layer 56 are the pixel electrodes 36 which define the drain electrodes of the TFT switches 38. Source electrodes 60 also contact each channel 54 through the other of the vias 58 and overlie a portion of the passivation layer 56.

A top passivation layer 62 in the form of a photoresist is patterned so that it only overlies the active areas of the TFT switches 38. Thus, the majority of the pixel electrode 36 associated with each TFT switch 38 remains exposed. Semiconductor material film islands 64 overlie most of the patterned top passivation layer 62. Each semiconductor film island 64 contacts the pixel electrode of an adjacent TFT switch 38. As such, the semiconductor film islands 64 have generally domed or U-shaped (upside down) contours when viewed in cross-section such as along the section lines 4—4 and/or 5—5 of FIG. 3.

Above the TFT switch array is the radiation transducer C$_{SE}$. The radiation transducer is in the form of a selenium (Se) radiation conversion layer 70 having a thickness of approximately 300 μm to 500 μm. Above the radiation conversion layer is a top electrode 72 formed of In, Al or Au. The top electrode 72 is coupled to a high potential voltage source 74 in the order of 3 kV to provide the necessary bias to the radiation transducer C$_{SE}$.

In operation, the top electrode 72 is biased to a high potential by source 74 and the flat panel detector 20 is exposed to radiation, resulting in an electric field being created in the radiation conversion layer 70 which causes electrons to move towards the top electrode 72 and holes to move towards the pixel electrodes 36. The majority of the holes drift to the exposed pixel electrodes where positive charges are accumulated. However, some holes drift to the semiconductor film islands 64 overlying the patterned top passivation layer 62. Because each semiconductor film island 64 contacts only one pixel electrode 36, the charge accumulated by each semiconductor film island 64 drifts to an individual pixel electrode 36. Therefore, the provision of the semiconductor film islands 64 over the patterned top passivation layer 62 and contacting one pixel electrode 36 reduces decay-lag resulting from trapped holes in the dead zones of the flat panel detector 20 between adjacent pixel electrodes 36 and inhibits the migration of charge from one pixel 22 to another.

During fabrication of the flat panel detector 20, the passivation layer 62 and the semiconductor film 64 are deposited on the TFT switch array as continuous layers. Photolithography techniques are then used to pattern layer 62 and film 64.

Figure 6:
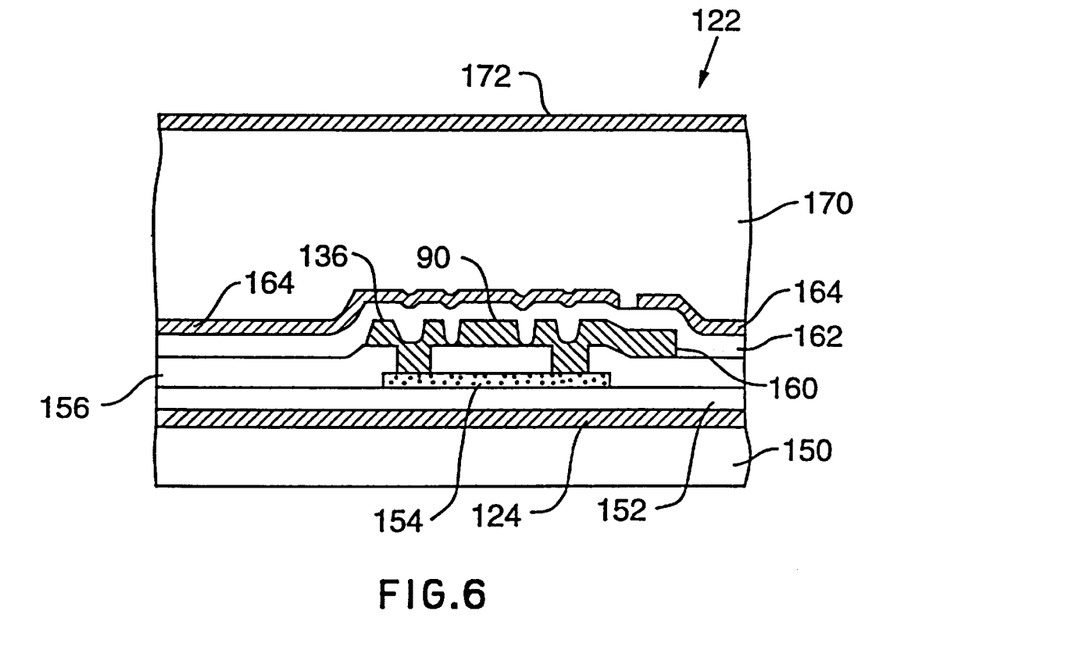
FIG. 6 is a cross-sectional view of a portion of an alternative embodiment of a flat panel detector for radiation imaging.

Referring now to FIG. 6, a pixel forming a portion of another embodiment of a flat panel detector 120 for radiation imaging is shown. In this embodiment, like reference numerals will be used to indicate like components with "100" added for clarity. Unlike the previous embodiment, each TFT switch 138 includes a bottom gate line 124 as well as a top gate electrode 90. The top gate electrodes 90 and the bottom gate lines 124 are electrically connected and are driven by a negative potential until it is desired to read the charges held by the pixel electrodes 136. The negative potential on the top gate electrodes 90 and the bottom gate lines 124 inhibits charges that accumulate in the semiconductor film islands 64 from turning the TFT switches 138 on while the flat panel detector 20 is exposed to incident radiation.

Figure 7:
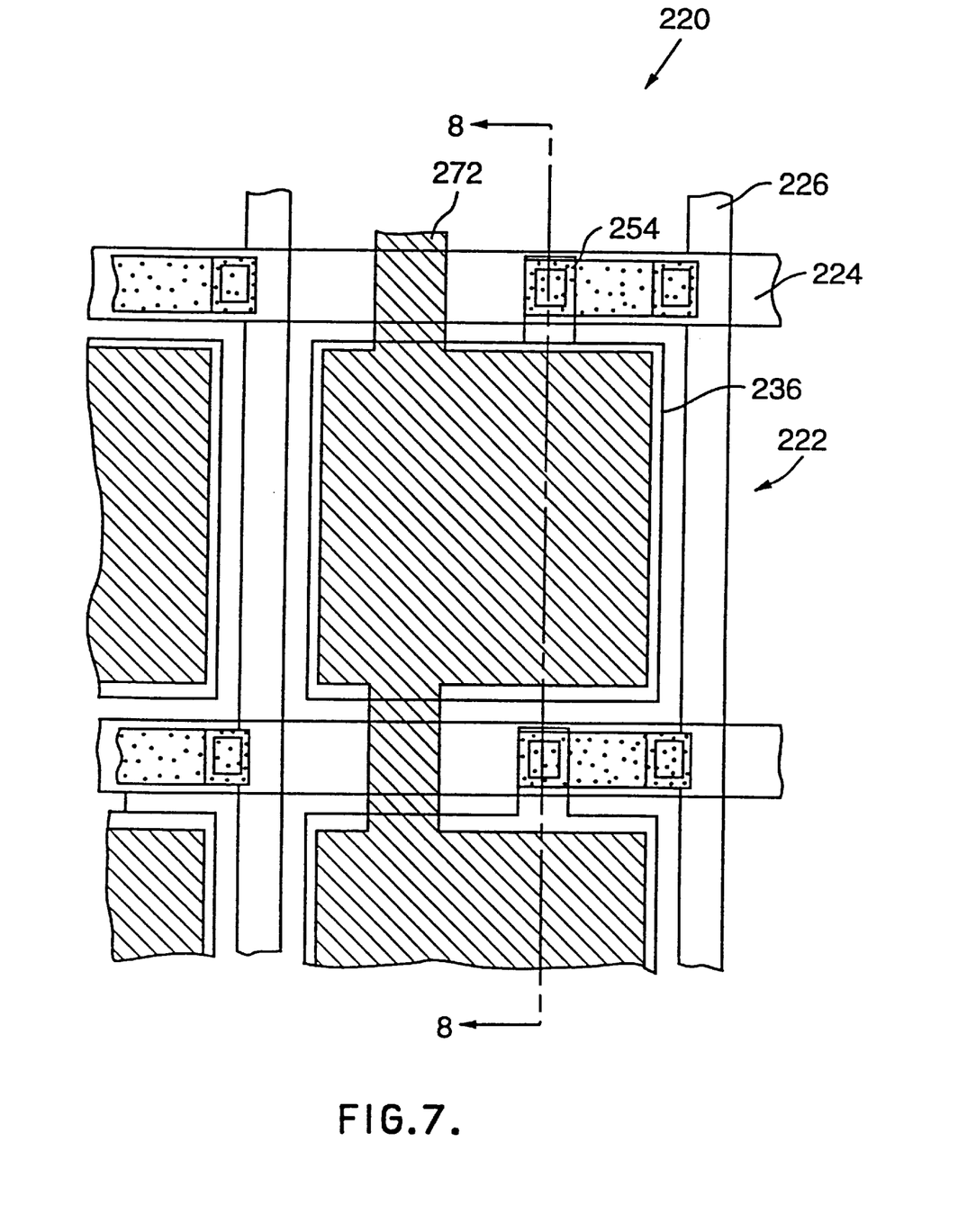
FIG. 7 is a top plan view of a portion of yet another embodiment of a flat panel detector for radiation imaging.
Figure 8:
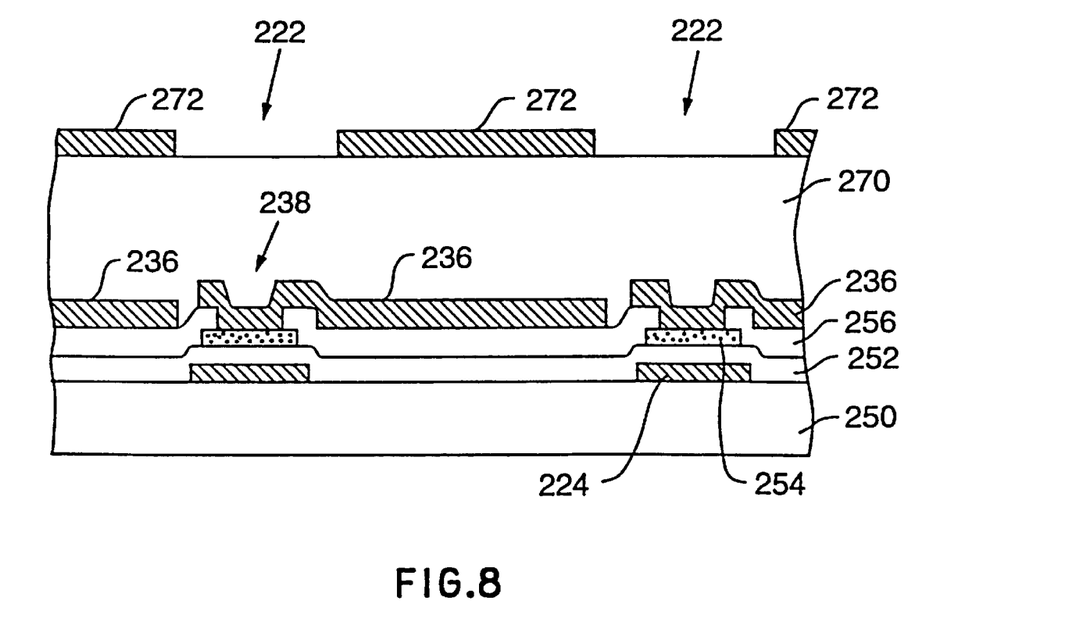
FIG. 8 is a cross-sectional view of FIG. 7 taken along line 8—8.

Referring now to FIGS. 7 and 8, yet another embodiment of a flat panel detector 220 for radiation imaging is shown. In this embodiment, like reference numerals will be used to indicate like components with a "200" added for clarity. As can be seen, the flat panel detector 220 is very similar to that shown in FIGS. 3 to 5. However, the passivation layer 62 and semiconductor film islands 64 have been removed and the top electrode 272 has been patterned so that no electrode exists over the dead zones of the flat panel detector 220. This absence of the top electrode 272 over the dead zones prevents an electric field from being created in the radiation conversion layer 270 in those zones and therefore, no electron-hole pairs are separated in those zones. This inhibits any charge from being trapped in the radiation conversion layer 270 over the dead zones. However, because the top electrode 272 remains over the pixel electrodes 236, an electric field is created in the radiation conversion layer 270 over the pixel electrodes 236. This allows electron-hole pairs to be separated resulting in a charge being accumulated and stored by the pixel electrodes 236 when the flat panel detector is exposed to incident radiation.

Figure 9:
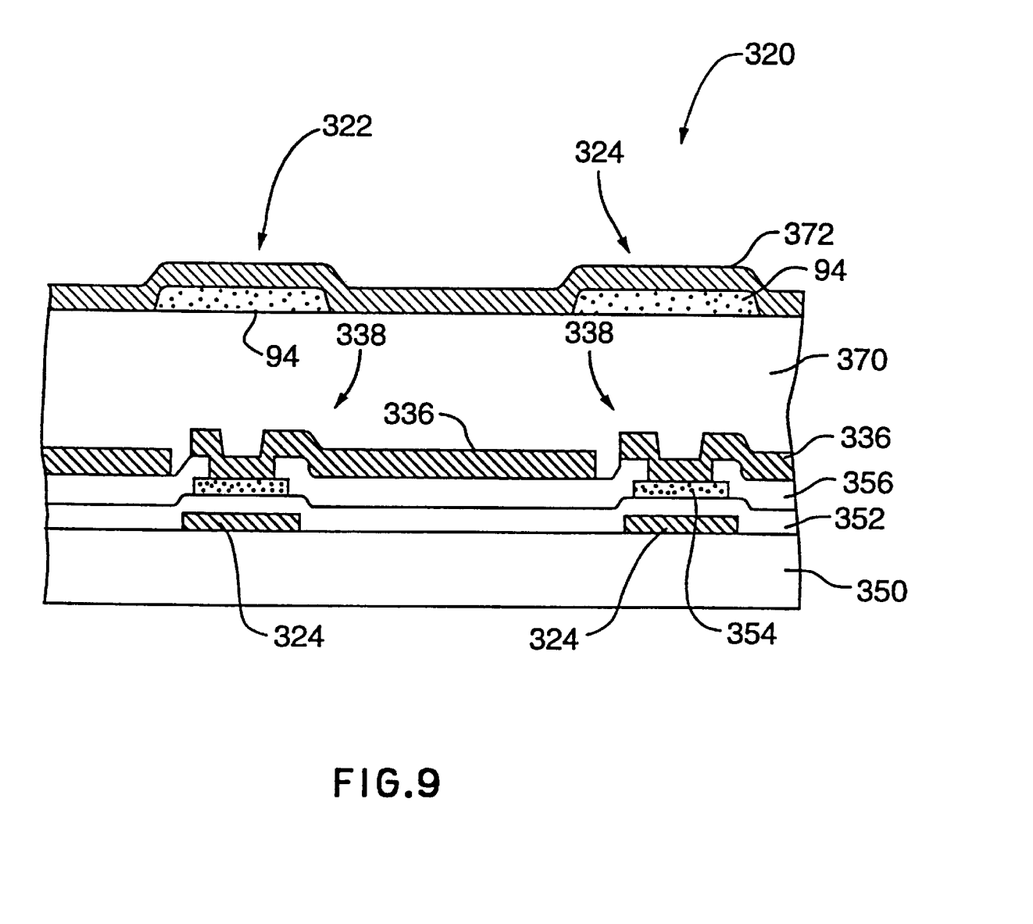
FIG. 9 is a cross-sectional view of a portion of still yet another embodiment of a flat panel detector for radiation imaging.

Referring now to FIG. 9, still yet another embodiment of a flat panel detector 320 for radiation imaging is shown. In this embodiment, like reference numerals will be used to indicate like components with a "300" added for clarity. The flat panel detector 320 is very similar to that shown in the previous embodiment with the exception that rather than removing portions of the top electrode 372 over the dead zones of the flat panel detector 320, an insulator 94 is deposited between the top electrode 372 and the radiation conversion layer 370 over the dead zones. The provision of the insulators 94 achieves the same results as does the previous embodiment by preventing an electric field from being created in the radiation conversion layer over the dead zones.

Figure 10A:
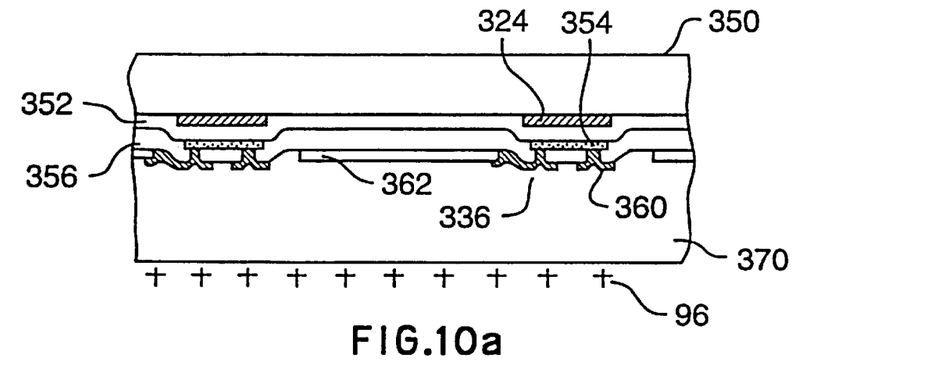
FIGS. 10a, 10b and 10c are cross-sectional views showing the process by which the portion of the flat panel detector of FIG. 9 is created.
Figure 10B:
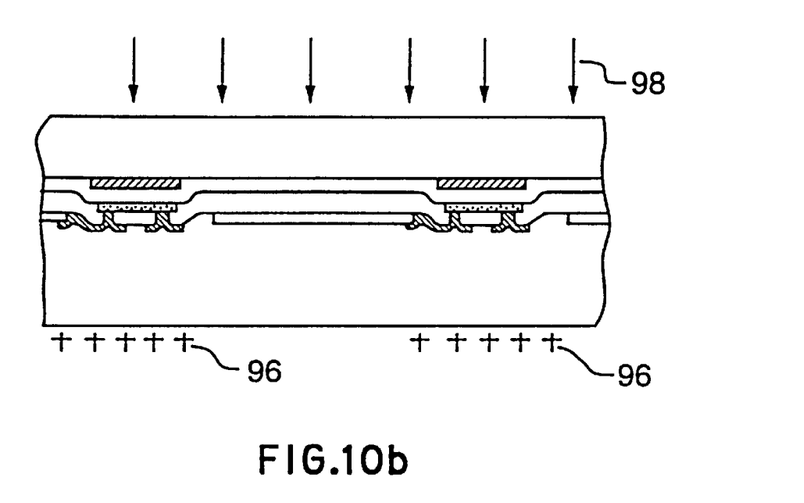
Figure 10C:
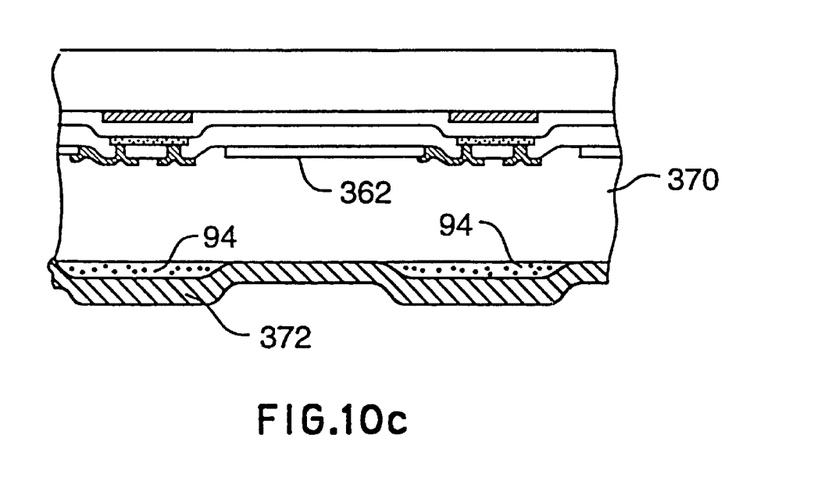

FIGS. 10a to 10c show how the insulators 94 can be deposited on the radiation conversion layer 370 before the top electrode 372 is placed on the radiation conversion layer. Specifically, prior to placing the top electrode 372 on the radiation conversion layer 370, the structure is subjected to a corona discharge to charge the top surface of the radiation conversion layer 370 to a high potential in the order of +3000 V as indicated by reference numeral 96. The TFT switches 338 are turned on and the substrate 350 is exposed to blue light 98. The blue light passes through the structure in all areas except at the area of the TFT switches 338 due to the opaque gate lines 324 and the area on the data lines (source lines). The light which passes through the structure and into the radiation conversion layer 370 creates charge carriers in the radiation conversion layer which are drawn to its upper charged surface. The charge carriers neutralize the charge created by the corona discharge in the areas above the pixel electrodes 336. The structure is than sent through toner development. The remaining charged areas of the radiation conversion layer 370 (i.e. those regions over the active area of the TFT switches ("the dead zones")) are covered by toner particles 94 which act as a good insulator. The radiation conversion layer 370 and toner particles 94 are then coated with the top electrode 372.

The present invention provides advantages in that the design of the flat panel detector inhibits charges from being trapped in the dead zones of the TFT switch array (i.e. the areas between pixel electrodes). Also, since the pixels are isolated into islands, image blooming is reduced.

Although a number of embodiments of a flat panel detector for radiation imaging have been shown with particular reference to specific materials forming the various components, it should be apparent to those of skill in the art that other suitable materials may be used.

In addition, those of skill in the art will also appreciate that alternative structures to inhibit charges from being trapped in the radiation conversion layer or migrating to a plurality of adjacent pixel sensors are well within the scope of the present invention as defined by the appended claims.

What is claimed is:

1. A flat panel detector for radiation imaging comprising:
   an array of pixels each of which includes a pixel electrode to store a charge proportional to the exposure of said pixel sensor to radiation;
   a radiation transducer over said array to be exposed to incident radiation; and
   means positioned over dead zones between adjacent pixel electrodes for inhibiting the accumulation of charge in said radiation transducer over said dead zones, wherein said inhibiting means includes generally U-shaped islands formed of semiconductor material between said array and said radiation transducer, each island surrounding and contacting three sides of a respective pixel electrode.

2. A flat panel detector as defined in claim 1 wherein said each of said islands contacts only one pixel electrode.

3. A flat panel detector for radiation imaging comprising:
   an array of pixels each of which includes a pixel electrode to store a charge proportional to the exposure of said pixel sensor to radiation;
   a radiation transducer over said array to be exposed to incident radiation; and
   means positioned over dead zones between adjacent pixel electrodes for inhibiting the accumulation of charge in said radiation transducer over said dead zones, wherein said inhibiting means includes a patterned top electrode forming part of said radiation transducer, said top electrode being absent over said dead zones.

4. A flat panel detector for radiation imaging comprising:
   an array of pixels each of which includes a pixel electrode to store a charge proportional to the exposure of said pixel sensor to radiation;
   a radiation transducer over said array to be exposed to incident radiation; and
   means positioned over dead zones between adjacent pixel electrodes for inhibiting the accumulation of charge in said radiation transducer over said dead zones, wherein said radiation transducer is in the form of a top electrode and a radiation conversion layer below said top electrode and wherein said inhibiting means includes insulation islands between said top electrode and said radiation conversion layer and positioned over said dead zones.

5. A flat panel detector for radiation imaging comprising:
   an array of pixels each of which includes a pixel electrode to store a charge proportional to the exposure of said pixel sensor to radiation;
   a radiation transducer over said array to be exposed to incident radiation; and
   means positioned over dead zones between adjacent pixel electrodes for inhibiting the accumulation of charge in said radiation transducer over said dead zones, wherein said radiation transducer is in the form of a top electrode and a radiation conversion layer below said top electrode and wherein said inhibiting means includes insulation islands between said top electrode and said radiation conversion layer and positioned over said dead zones, wherein said insulation islands are formed of toner particles.

6. A flat panel detector for radiation imaging comprising:
   a radiation transducer including a radiation conversion layer and an electrode on one side of said radiation conversion layer;
   an array of pixels arranged in rows and columns on the other side of said radiation conversion layer, each of said pixels including a pixel electrode to accumulate charge as a result of hole drift in said radiation conversion layer occurring upon exposure of said radiation transducer to radiation and when said electrode is biased;
   a plurality of sources lines upon which charges accumulated by said pixels can be sensed, each of said source lines connecting the pixels in one of said rows or columns;
   a plurality of gatelines upon which gating signals are supplied to allow accumulated charges to be sensed, each of said gate lines connecting the pixels in the other of said rows or columns; and
   means for inhibiting the accumulation of charge in said radiation transducer over dead zones between adjacent pixel electrodes, wherein said inhibiting means includes generally U-shaped islands formed of semiconductor material between said array and said radiation transducer, each island surrounding and contacting three sides of a respective pixel electrode.

7. A flat panel detector for radiation imaging comprising:
   a radiation transducer including a radiation conversion layer and an electrode on one side of said radiation conversion layer;
   an array of pixels arranged in rows and columns on the other side of said radiation conversion layer, each of said pixels including a pixel electrode to accumulate charge as a result of hole drift in said radiation conversion layer occurring upon exposure of said radiation transducer to radiation and when said electrode is biased;
   a plurality of sources lines upon which charges accumulated by said pixels can be sensed, each of said source lines connecting the pixels in one of said rows or columns;
   a plurality of gate lines upon which gating signals are supplied to allow accumulated charges to be sensed, each of said gate lines connecting the pixels in the other of said rows or columns; and
   means for inhibiting the accumulation of charge in said radiation transducer over dead zones between adjacent pixel electrodes, wherein said inhibiting means includes a patterned top electrode forming part of said radiation transducer, said top electrode being absent over said dead zones.

8. A flat panel detector imaging comprising:
   a radiation transducer including a radiation conversion layer and an electrode on one side of said radiation conversion layer;
   an array of pixels arranged in rows and columns on the other side of said radiation conversion layer, each of said pixels including a pixel electrode to accumulate charge as a result of hole drift in said radiation conversion layer occurring upon exposure of said radiation transducer to radiation and when said electrode is biased;

a plurality of sources lines upon which charges accumulated by said pixels can be sensed, each of said source lines connecting the pixels in one of said rows or columns;

a plurality of gate lines upon which gating signals are supplied to allow accumulated charges to be sensed, each of said gate lines connecting the pixels in the other of said rows or columns; and means for inhibiting the accumulation of charge in said radiation transducer over dead zones between adjacent pixel electrodes, wherein said inhibiting means includes insulation islands between said top electrode and said radiation conversion layer and positioned over said dead zones.

9. In a method of forming a flat panel detector for radiation imaging including a radiation transducer having a radiation conversion layer and an electrode on one side thereof and an array of pixels arranged in rows and columns on the other side of said radiation conversion layer, each pixel including a pixel electrode to store charge proportional to the exposure of said flat panel detector to radiation, said method further comprising the step of:

providing means over dead zones between adjacent pixel electrodes for inhibiting the accumulation of charge in said radiation transducer, wherein said inhibiting means is provided by forming a continuous semiconductor film over said array and etching said film to define generally U-shaped islands positioned over said dead zones and each island contacting three sides of respective pixel electrode.

10. A flat panel detector as defined in claim 9 wherein said film is etched using photolithography techniques.

11. In a method of forming a flat panel detector for radiation imaging including a radiation transducer having a radiation conversion layer and an electrode on one side thereof and an array of pixels arranged in rows and columns on the other side of said radiation conversion layer, each pixel including a pixel electrode to store charge proportional to the exposure of said flat panel detector to radiation, said method further comprising the step of:

providing means over dead zones between adjacent pixel electrodes for inhibiting the accumulation of charge in said radiation transducer, wherein said inhibiting means is provided by patterning said electrode so that said electrode is absent over said dead zones.

12. In a method of forming a flat panel detector for radiation imaging including a radiation transducer having a radiation conversion layer and an electrode on one side thereof and an array of pixels arranged in rows and columns on the other side of said radiation conversion layer, each pixel including a pixel electrode to store charge proportional to the exposure of said flat panel detector to radiation, said method further comprising the step of:

providing means over dead zones between adjacent pixel electrodes for inhibiting the accumulation of charge in said radiation transducer, wherein said inhibiting means is provided by forming insulation islands between said radiation conversion layer and said electrode over said dead zones.

13. A method of forming a flat panel detector for radiation imaging including a radiation transducer having a radiation conversion layer and an electrode on one side thereof and an array of pixels arranged in rows and columns on the other side of said radiation conversion layer, each pixel including a pixel electrode to store charge proportional to the exposure of said flat panel detector to radiation, said method further comprising the step of:

providing means over dead zones between adjacent pixel electrodes for inhibiting the accumulation of charge in said radiation transducer, wherein said inhibiting means is provided by forming insulation islands between said radiation conversion layer and said electrode over said dead zones;

charging the surface of said radiation conversion layer over said dead zones to form said insulation islands; and passing said radiation transducer through toner development prior to placing said electrode thereon.

14. A method of forming a flat panel detector for radiation imaging including a radiation transducer having a radiation conversion layer and an electrode on one side thereof and an array of pixels arranged in rows and columns on the other side of said radiation conversion layer, each pixel including a pixel electrode to store charge proportional to the exposure of said flat panel detector to radiation, said method further comprising the step of:

providing means over dead zones between adjacent pixel electrodes for inhibiting the accumulation of charge in said radiation transducer, wherein said inhibiting means is provided by forming insulation islands between said radiation conversion layer and said electrode over said dead zones;

charging the surface of said radiation conversion layer over said dead zones to forms said insulation islands;

passing said radiation transducer through toner development prior to placing said electrode thereon;

charging said radiation conversion layer by subjecting said radiation conversion layer to a corona discharge to charge the one surface thereof; and then subjecting the areas of said radiation conversion layer to be free of charge to blue light.

* * * * *